United States Patent
Li

(10) Patent No.: US 10,216,317 B2
(45) Date of Patent: Feb. 26, 2019

(54) TOUCH SCREEN, DISPLAY DEVICE AND METHOD OF OPERATING DISPLAY DEVICE

(71) Applicant: BOE TECHNOLOGY GROUP CO., LTD., Beijing (CN)

(72) Inventor: Wusheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 15/261,757

(22) Filed: Sep. 9, 2016

(65) Prior Publication Data

US 2017/0123565 A1    May 4, 2017

(30) Foreign Application Priority Data

Oct. 28, 2015  (CN) .......................... 2015 1 0713672

(51) Int. Cl.
| | |
|---|---|
| G06F 11/22 | (2006.01) |
| G06F 3/041 | (2006.01) |
| G06F 3/044 | (2006.01) |
| H01L 27/32 | (2006.01) |
| G02F 1/1333 | (2006.01) |

(Continued)

(52) U.S. Cl.
CPC ............ *G06F 3/0416* (2013.01); *G06F 3/041* (2013.01); *G06F 3/044* (2013.01); *G06F 3/0412* (2013.01); *G06F 11/2221* (2013.01); *G02F 1/13338* (2013.01); *G02F 1/133308* (2013.01); *G02F 1/133345* (2013.01); *G02F 1/133502* (2013.01); *G02F 1/134309* (2013.01); *G06F 2203/04107* (2013.01); *G06F 2203/04111* (2013.01); *H01L 27/323* (2013.01)

(58) Field of Classification Search
None
See application file for complete search history.

(56) References Cited

U.S. PATENT DOCUMENTS

| | | | |
|---|---|---|---|
| 2011/0261009 A1 | 10/2011 | Inagaki et al. | |
| 2013/0082961 A1* | 4/2013 | Wang ...................... | G06F 3/044 345/173 |

(Continued)

FOREIGN PATENT DOCUMENTS

| | | |
|---|---|---|
| CN | 102236467 A | 11/2011 |
| CN | 202267419 U | 6/2012 |

(Continued)

OTHER PUBLICATIONS

Office Action in Chinese Application No. 201510713672.1 dated Aug. 1, 2017, with English translation.

*Primary Examiner* — Ifedayo B Iluyomade
(74) *Attorney, Agent, or Firm* — Womble Bond Dickinson US LLP

(57) ABSTRACT

Disclosed is a touch screen which includes: a display panel; a cover plate located at a light exit side of the display panel; a plurality of touch electrodes located at a side of the cover plate facing towards the display panel; and a bezel portion surrounding the touch electrodes and comprising a non-black photoresist layer, a low-reflectivity conductive layer and an insulating layer which are successively stacked in a direction from the cover plate to the display panel. Also disclosed are a display device and a method of operating the display device.

18 Claims, 4 Drawing Sheets

(51) Int. Cl.
    *G02F 1/1335*     (2006.01)
    *G02F 1/1343*     (2006.01)

(56) References Cited

U.S. PATENT DOCUMENTS

| | | | |
|---|---|---|---|
| 2015/0070794 A1* | 3/2015 | Wu | G06F 1/1692 359/838 |
| 2016/0154527 A1* | 6/2016 | Jiang | G06F 3/041 345/173 |
| 2016/0356928 A1 | 12/2016 | Li et al. | |
| 2017/0285820 A1 | 10/2017 | Li et al. | |

FOREIGN PATENT DOCUMENTS

| | | | |
|---|---|---|---|
| CN | 201410718261 | * | 12/2014 |
| CN | 201410718261.7 | * | 12/2014 |
| CN | 104281325 A | | 1/2015 |
| CN | 204102094 U | | 1/2015 |
| CN | 104656997 A | | 5/2015 |
| CN | 104700721 A | | 6/2015 |

* cited by examiner

TOUCH SCREEN, DISPLAY DEVICE AND METHOD OF OPERATING DISPLAY DEVICE

CROSS-REFERENCE TO RELATED APPLICATIONS

The present application claims the benefit of Chinese Patent Application No. 201510713672.1, filed on Oct. 28, 2015, the entire disclosure of which is incorporated herein by reference.

TECHNICAL FIELD

The present disclosure relates to the field of display technology, and particularly to a touch screen, a display device and a display driving method for controlling the display device.

BACKGROUND

A touch screen generally has a black bezel formed by a black matrix material for sheltering touch electrode lead wires. A solution has been proposed in which a non-black bezel is formed by substituting a non-black photoresist material for the black matrix material. This may satisfy users' aesthetic demands.

However, the non-black photoresist material has a small optical density, leading to an undesirable light-shielding effect. Hence, a black photoresist layer still needs to be added on the non-black photoresist layer. To achieve a good light-shielding effect, the black photoresist layer generally has a thickness of about 1 μm. Such a thickness requires a large bend when a touch electrode is led out in the bezel region, which tends to cause breakage of the touch electrode.

Hence, there is a need for a touch screen having a non-black bezel with a reduced thickness.

SUMMARY

Embodiments of the present disclosure provide a touch screen, a display device and a method of operating the display device. In the touch screen, a non-black bezel with a reduced thickness is provided by using a low-reflectivity conductive material in a bezel region.

According to an aspect of the present disclosure, there is provided a touch screen including: a display panel; a cover plate located at a light exit side of the display panel; a plurality of touch electrodes located at a side of the cover plate facing towards the display panel; and a bezel portion, located at the side of the cover plate facing towards the display panel, and surrounding the touch electrodes. The bezel portion includes a non-black photoresist layer, a low-reflectivity conductive layer and an insulating layer which are successively stacked in a direction from the cover plate to the display panel.

In some embodiments, the low-reflectivity conductive layer is made of a material selected from a group consisting of molybdenum alloy, molybdenum oxide and molybdenum alloy oxide.

In some embodiments, the low-reflectivity conductive layer has a thickness ranging from 45 nm to 60 nm.

In some embodiments, the low-reflectivity conductive layer has a reflectivity ranging from 4% to 6%.

In some embodiments, the insulating layer is made of silicon nitride.

In some embodiments, the insulating layer has a thickness ranging from 100 nm to 900 nm.

In some embodiments, the touch electrodes are led out at a side of the insulating layer facing towards the display panel.

According to another aspect of the present disclosure, there is provided a display device including the above-mentioned touch screen.

In some embodiments, the display device further comprises: a resistance sensor electrically connected with the low-reflectivity conductive layer for sensing a resistance of the low-reflectivity conductive layer and for outputting a signal indicative of the sensed resistance; and a controller electrically connected with the resistance sensor and the display panel for controlling the display panel to display a first display interface in response to the signal from the resistance sensor indicating that the resistance of the low-reflectivity conductive layer has changed.

In some embodiments, the display device further comprises a power button for powering on/off the display device. The controller is configured to control the resistance sensor to sense the resistance of the low-reflectivity conductive layer in response to the power button being pressed for a first period of time.

In some embodiments, the display device is a mobile communication device. The first display interface comprises an option for pressing the power button for a second period of time to call a predetermined telephone number.

In some embodiments, the controller is further configured to control the display panel to display a second display interface different from the first display interface in response to the signal from the resistance sensor indicating that the resistance of the low-reflectivity conductive layer has not changed.

In some embodiments, the resistance sensor is configured to continuously sense the resistance of the low-reflectivity conductive layer.

In some embodiments, the low-reflectivity conductive layer surrounds the touch electrodes to form a closed structure. The resistance sensor is configured to sense the resistance of the closed structure.

In some embodiments, the low-reflectivity conductive layer surrounds the touch electrodes to form a non-closed structure having a gap. The resistance sensor is configured to sense the resistance from one end of the non-closed structure to the other end.

According to a further aspect of the present disclosure, there is provided a method of operating the above-mentioned display device. The method including: sensing whether a resistance of the low-reflectivity conductive layer has changed; and displaying, by the display panel, a first display interface in response to a change in the resistance of the low-reflectivity conductive layer being sensed.

In some embodiments, the method further comprises displaying, by the display panel, a second display interface different from the first display interface in response to no change in the resistance of the low-reflectivity conductive layer being sensed. These and other aspects of the present disclosure will be apparent from and elucidated with reference to the embodiment(s) described hereinafter.

BRIEF DESCRIPTION OF THE DRAWINGS

Further details, features and advantages of the disclosure are disclosed in the following description of exemplary embodiments in connection with the accompanying drawings, in which.

DETAILED DESCRIPTION

Figure 1:
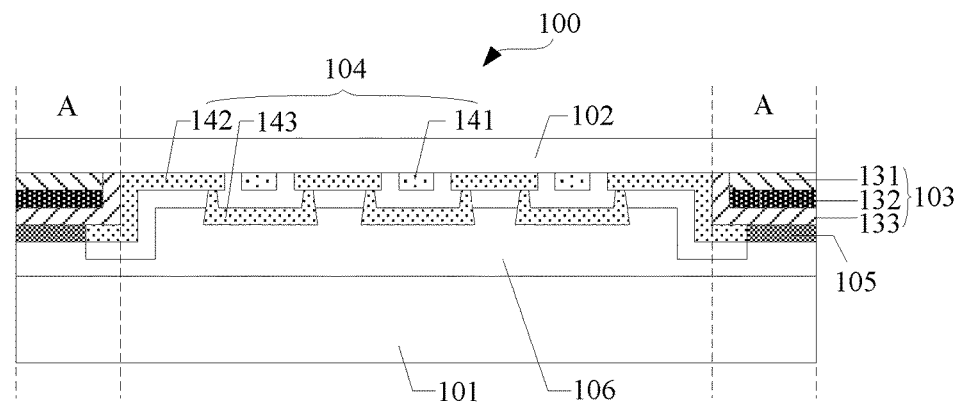
FIG. 1 illustrates a sectional view of a touch screen according to an embodiment of the present disclosure.

The present disclosure will now be described more fully hereinafter with reference to the accompanying drawings, in which exemplary embodiments of the disclosure are shown. The present disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Like reference numerals refer to like elements throughout. The figures are not drawn to scale and only illustrate embodiments of the present disclosure.

FIG. 1 illustrates a sectional view of a touch screen 100 according to an embodiment of the present disclosure. Referring to FIG. 1, the touch screen 100 comprises a display panel 101, a cover plate 102, a bezel portion 103 and a plurality of touch electrodes 104.

The display panel 101 may be an organic light-emitting diode (OLED) display panel or liquid crystal display panel (LCD). However, the present disclosure is not so limited.

The cover plate 102 is located at a light exit side of the display panel 101. The touch electrodes 104 are located at a side of the cover plate 102 facing towards the display panel 101. The arrangement of the touch electrode 104 may be based on known touch sensing technologies. In the example shown in FIG. 2, the touch electrodes 104 comprise touch driving electrodes 141 and touch sensing electrodes 142 which are insulating from each other. The touch driving electrodes 141 and the touch sensing electrodes 142 intersect each other, with mutual capacitance or self-capacitance being formed at the intersections. Segments of each touch sensing electrode 142 are bridged by wires 143.

In addition, the touch electrodes 104 are led out at a side of the insulating layer 133 facing towards the display panel 101. To this end, the touch screen 100 further comprises touch electrode lead wires 105 which are located in a bezel region A where the bezel portion 103 is disposed and which are electrically connected with the respective touch electrodes 104.

The bezel portion 103 is located at the side of the cover plate 102 facing towards the touch electrodes 104, and surrounds the touch electrodes 104. The bezel portion 103 comprises a non-black photoresist layer 131, a low-reflectivity conductive layer 132 and an insulating layer 133 which are successively stacked in a direction from the cover plate 102 to the display panel 101. The bezel portion 103 may serve to shelter the touch electrode lead wires 105 and the non-black photoresist layer 131 therein may provide the touch screen 100 with an appearance of non-black bezel. Due to its low reflectivity, the low-reflectivity conductive layer 132 may have a thickness smaller than a black photoresist layer otherwise used (discussed later), while still provides a good light-shielding capability. The insulating layer 133 may avoid short-circuiting caused by electrical connection between the low-reflectivity conductive layer 132 and the touch electrodes 104.

To protect the touch electrodes 104 from damages, a protective layer 106 may be further disposed on a side of the touch electrodes 104 facing away from the cover plate 102. The protective layer 106 may be made of any one of acrylic resin, silicon nitride, silicon oxide and silicon oxynitride.

In some embodiments, the low-reflectivity conductive layer 132 may be made of any one of molybdenum alloy (e.g., MoTi, or MoO) and molybdenum alloy oxide (e.g., MoTAO or MoNbO). However, the low-reflectivity conductive layer 132 is not limited to the materials described.

In an embodiment in which the low-reflectivity conductive layer 132 is formed by MoO, the low-reflectivity conductive layer 132 may be prepared using the following method. First, magnetically-controlled spluttering is performed for a Mo target material in an oxygen ($O_2$) environment to obtain a deposited MoO thin film. Then, the deposited MoO thin film is patterned to form the low-reflectivity conductive layer 132. In an embodiment in which the low-reflectivity conductive layer 132 is formed by molybdenum alloy or molybdenum alloy oxide, the low-reflectivity conductive layer 132 may be prepared using the following method. First, magnetically-controlled spluttering is performed for a Mo alloy target material in an argon (Ar) or oxygen ($O_2$) environment to obtain a deposited molybdenum alloy thin film or molybdenum alloy oxide thin film. Then, the molybdenum alloy thin film or molybdenum alloy oxide thin film is patterned to form the low-reflectivity conductive layer 132.

The reflectivity of the low-reflectivity conductive layer 132 is related to the thickness of the low-reflectivity conductive layer 132. In some embodiments, the low-reflectivity conductive layer 132 may have a thickness ranging from 45 nm to 60 nm, for example 50 nm.

Figure 2:
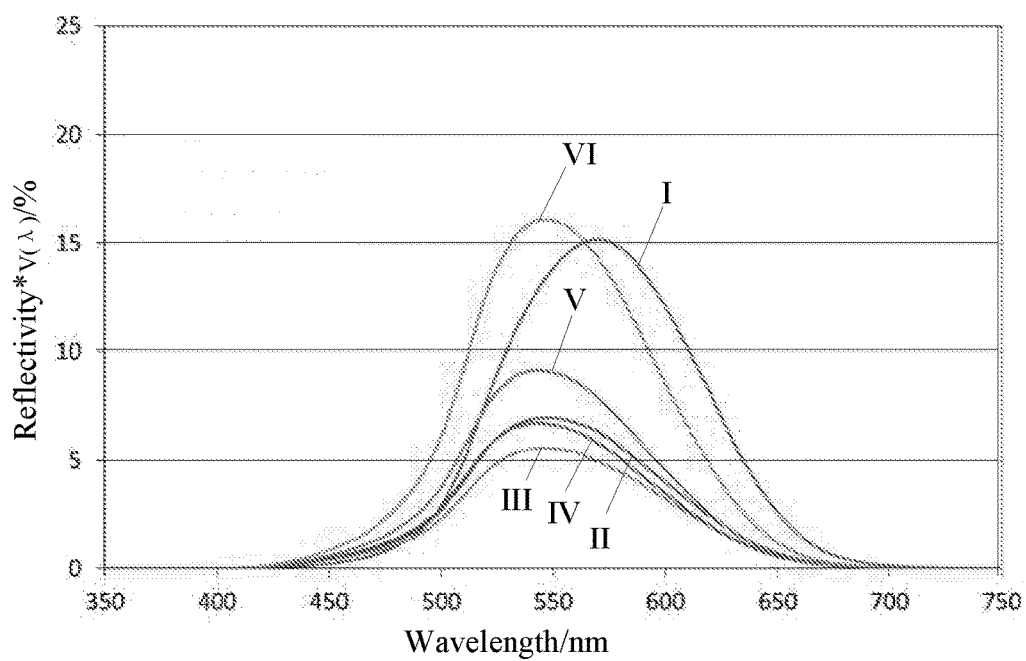
FIG. 2 illustrates a curve diagram showing corresponding reflectivity of a MoTaO thin film with different thicknesses.

FIG. 2 illustrates a curve diagram showing corresponding reflectivity of a MoTaO thin film with different thicknesses. In view that human eyes are most sensitive to light with a wavelength of 550 nm, a visual function $V(\lambda)$ for human eyes is introduced. The longitudinal coordinate of FIG. 2 represents a product of the reflectivity and the visual function $V(\lambda)$, and the transverse coordinate represents a wavelength.

Curves I to VI are reflectivity curves of MoTaO thin films with thicknesses of 35 nm, 45 nm, 50 nm, 55 nm, 60 nm and 75 nm, respectively. It can be seen that the MoTaO thin film with a thickness of 50 nm has a minimum reflectivity which is about 5%. This is substantially consistent with the reflectivity of the black matrix material. The MoTaO thin film with a thickness ranging from 45 nm to 60 nm has a reflectivity which is not so low and in a range of 4% to 6%.

Referring back to FIG. 1, the insulating layer 133 may have a thickness ranging from 100 nm to 900 nm, e.g. 100 nm. In some embodiments, the insulating layer 133 may be made of silicon nitride (SiNx). In other embodiments, the insulating layer 133 may be made of other insulating materials.

A comparison is performed below between an existing touch screen in which a non-black photoresist layer and a black photoresist layer are used as the bezel portion, and the touch screen according to embodiments of the present disclosure in which the non-black photoresist layer, the low-reflectivity conductive layer and the insulating layer are employed as the bezel portion.

In the existing touch screen, the black photoresist layer generally has a thickness of about 1 As stated above, in the touch screen 100 according to an embodiment of the present disclosure, the low-reflectivity conductive layer 132 has a thickness ranging from 45 nm to 60 nm, and the insulating layer 133 has a thickness ranging from 100 nm to 900 nm. That is, a sum of the thickness of the low-reflectivity conductive layer 132 and the thickness of the insulating layer 133 is in a range from 0.145 μm to 0.96 Hence, as compared with the existing touch screen, the touch screen according to an embodiment of the present disclosure has a bezel portion with a smaller thickness. Advantageously, the low-reflectivity conductive layer has a reflectivity that is substantially consistent with the black matrix material. This may provide a good light-shielding effect and a reduced thickness of the bezel portion, thereby alleviating or even eliminating the problem that the touch electrode is prone to breakage when being led out in the bezel region.

In a non-limiting embodiment, the touch screen 100 may be a touch screen based on the One Glass Solution (OGS) technology. A general fabrication process is described as follows. First, patterns of the non-black photoresist layer 131, the low-reflectivity conductive layer 132 and the insulating layer 133 are successively formed on the cover plate 102. Then, on the resultant cover plate 102, a pattern of the touch electrode 104 is formed. Finally, the cover plate 102 and the display panel 101 are cell-aligned with each other to form the touch screen 100.

Figure 3:
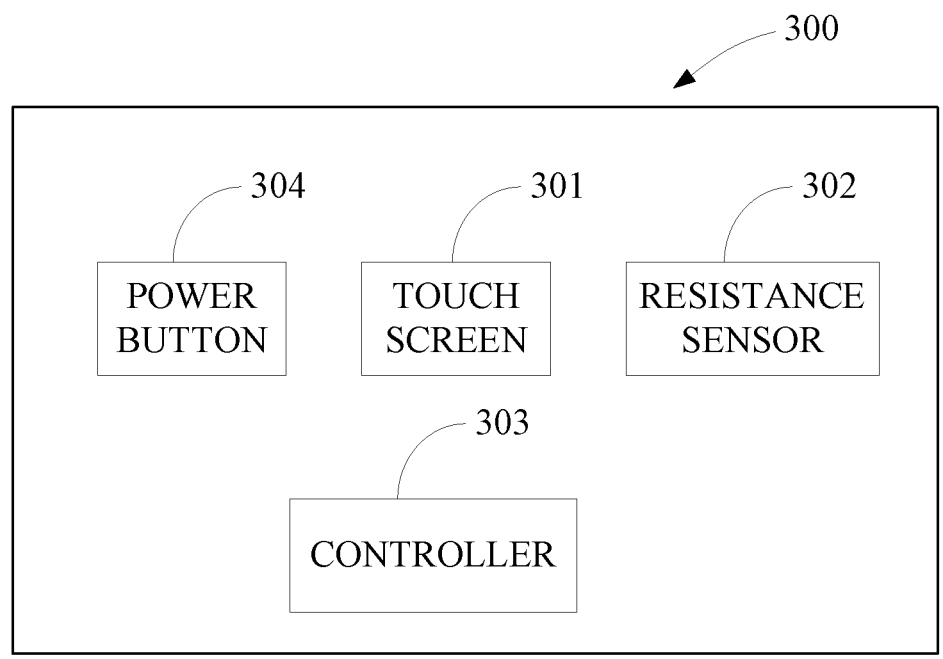
FIG. 3 illustrates a block diagram of a display device according to an embodiment of the present disclosure.

FIG. 3 illustrates a block diagram of a display device 300 according to an embodiment of the present disclosure. Referring to FIG. 3, the display device 300 comprises a touch screen 301. The touch screen 301 is the touch screen as described above with reference to FIGS. 1 and 2, and is now denoted by the reference number 301. The display device 300 may be any product or component having a display and touch function such as a mobile phone, a flat panel computer, a display, a laptop computer, a digital photo frame or a navigator.

In the example shown in FIG. 3, the display device 300 further comprises a resistance sensor 302 and a controller 303. The resistance sensor 302 is electrically connected with the low-reflectivity conductive layer 132 in the touch screen 301, and the controller 303 is electrically connected with the display panel 101 in the touch screen 301 and the resistance sensor 302.

The resistance sensor 302 is used to sense the resistance of the low-reflectivity conductive layer 132, and output a signal indicative of the sensed resistance. The controller 303 is used to determine whether the resistance of the low-reflectivity conductive layer 132 in the touch screen 301 changes based on the signal from the resistance sensor 302.

The capability of sensing whether the resistance of the low-reflectivity conductive layer 132 changes allows for providing the display device 300 with enhanced functionality, e.g., determining whether the bezel of the display device 300 is damaged, as will be described in detail below.

Figure 4:
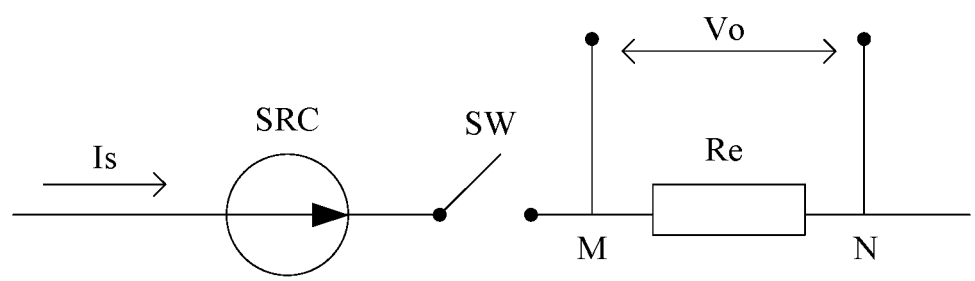
FIG. 4 illustrates an equivalent circuit diagram showing a working principle of an embodiment of a resistance sensor shown in FIG. 3.

FIG. 4 illustrates an equivalent circuit diagram showing a working principle of an embodiment of a resistance sensor shown in FIG. 3.

Referring to FIG. 4, the resistance sensor 302 comprises a constant current source SRC which provides a substantially constant current Is. The current Is flows through an equivalent resistor Re of the low-reflectivity conductive layer 132 from node M to node N. Given the constant current Is, the resistance of the equivalent resistor Re (namely, the low-reflectivity conductive layer 132) may be derived by measuring a voltage Vo at both ends of the equivalent resistor Re. That is, the magnitude of the voltage Vo indicates the resistance of the low-reflectivity conductive layer 132. An analog digital converter (not shown) may be used to measure the voltage Vo.

As such, the controller 303 may determine whether the resistance of the low-reflectivity conductive layer 132 changes based on the measured voltage Vo. In some embodiment, the controller 303 compares the measured voltage Vo with a reference value corresponding to a default resistance of the low-reflectivity conductive layer 132, and determines that the resistance of the low-reflectivity conductive layer 132 has changed if a difference between the measured voltage Vo and the reference value exceeds a predetermined threshold.

In some embodiments, the resistance sensor 302 further comprises a switch SW, as shown in FIG. 4. The switch SW allows the resistance sensor 302 to sense the resistance of the low-reflectivity conductive layer 132 only when the switch SW is closed for example in response to a control signal from the controller 303. This may reduce power consumption of the display device 300. An example of the switch SW is a switch transistor.

The constant current source SRC, switch SW and measuring of the voltage Vo are already known in the art, and therefore will not be described in detail. It will be appreciated that the working principle of the resistance sensor 302 as shown in FIG. 4 is exemplary, and that the resistance sensors 302 in other embodiments may operate based on other known resistance measuring principles.

Although the node M and node N in FIG. 4 are shown as both ends of the equivalent resistor Re connected to the low-reflectivity conductive layer 132, the arrangement of the node M and node N may vary in practice with the structure of the low-reflectivity conductive layer 132.

Figure 5A:
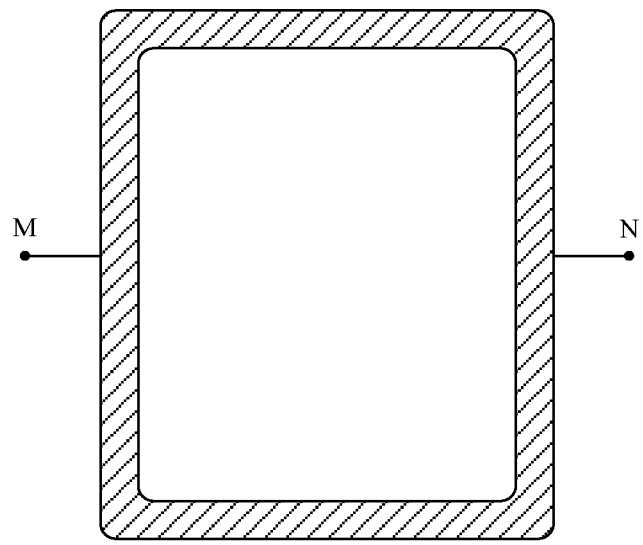
FIGS. 5A and 5B illustrate top views of a low-reflectivity conductive layer having different structures.
Figure 5B:
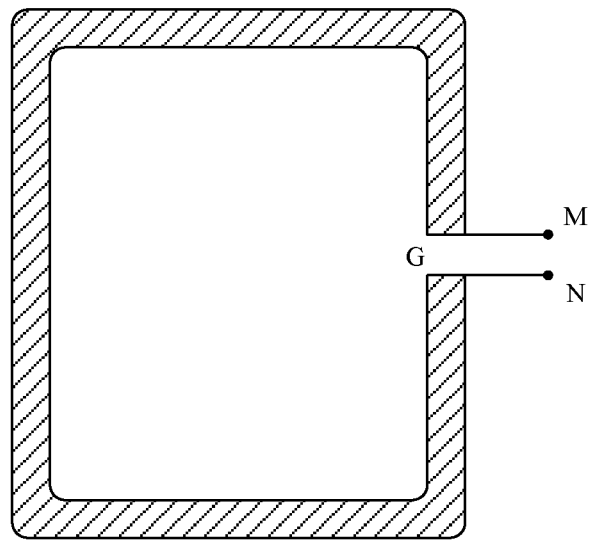

FIGS. 5A and 5B illustrate top views of the low-reflectivity conductive layer 132 with different structures.

Referring to FIG. 5A, the low-reflectivity conductive layer 132 forms a closed structure, which has a shape roughly the same as the outline of the touch screen. The resistance sensor 302 is configured to sense the resistance of the closed structure. Specifically, in this embodiment, the node M and node N are respectively connected to two positions of the closed structure that oppose to each other, so that the resistance between the node M and node N is sensed.

Referring to FIG. 5B, the low reflectivity conductive layer 132 forms a non-closed structure having a gap G. The node M is connected to one end of the non-closed structure, and the node N is connected to the other end of the non-closed structure, so that the resistance from one end of the non-closed structure to the other end is sensed. In some embodiments, the gap G has a spacing which is so small that it is difficult to be visually perceived.

As stated above, the change in the resistance of the low-reflectivity conductive layer 132 may indicate whether the bezel portion of the touch screen is damaged. The damage to the bezel portion usually means that the cover plate or the whole touch screen is damaged. This is especially true for the touch screen based on the OGS technology because the bezel portion in the OGS touch screen, together with the touch electrode, is fabricated on the cover plate. When the cover plate is damaged, the bezel portion and the touch electrode are also damaged, leading to a loss of the touch function. Hence, detection of the change in the resistance of the low-reflectivity conductive layer 132 may be used to implement enhanced applications, which will be described in detail below.

Referring back to FIG. 3, the display device 300 further comprises a power button 304 for powering on/off the display device 300. In some embodiments, a user presses the power button 304 to power on the display device 300, and finds that the touch screen 301 does not respond to touch operations. In this case, the user may press the power button 304 for a predetermined period of time, e.g., 2 s to 3 s. In response, the controller 303 controls the resistance sensor 302 to sense the resistance of the low-reflectivity conductive layer 132 in the touch screen 301. The controller 303 determines whether the resistance of the low-reflectivity conductive layer 132 changes based on the measurement from the resistance sensor 302.

If it is determined that the resistance of the low-reflectivity conductive layer 132 changes, the controller 303 may control the display panel 101 in the touch screen 301 to display a first display interface. The first display interface may comprise information prompting the user of the damage to the display screen. In an embodiment in which the display device 300 is a mobile communication device such as a mobile phone, the first display interface may comprise an option for pressing the power button for a second period of time to call a predetermined telephone number. The second period of time is for example from 5 s to 6 s. As such, although he cannot operate the display device 300 through the touch screen 301, the user can still use a limited function of the display device 300 via the power button 304. By way of example, and not limitation, the predetermined telephone number may be a telephone number called by the user most frequently or an emergency telephone number.

If it is determined that the resistance of the low-reflectivity conductive layer 132 has not changed, the controller 303 may control the display panel 101 in the touch screen 301 to display a second display interface. The second display interface is for example a conventional display interface which comprises options for conventional functions of the display device 300, such as power off or restart.

In an alternative embodiment, the resistance sensor 302 senses the resistance of the low-reflectivity conductive layer 132 continuously, and the controller 303 polls the resistance sensor 302 for the measurements. This may detect whether the resistance of the low-reflectivity conductive layer 132 changes substantially in real time, so that the user may learn about the working state of the display device 300 in time.

Figure 6:
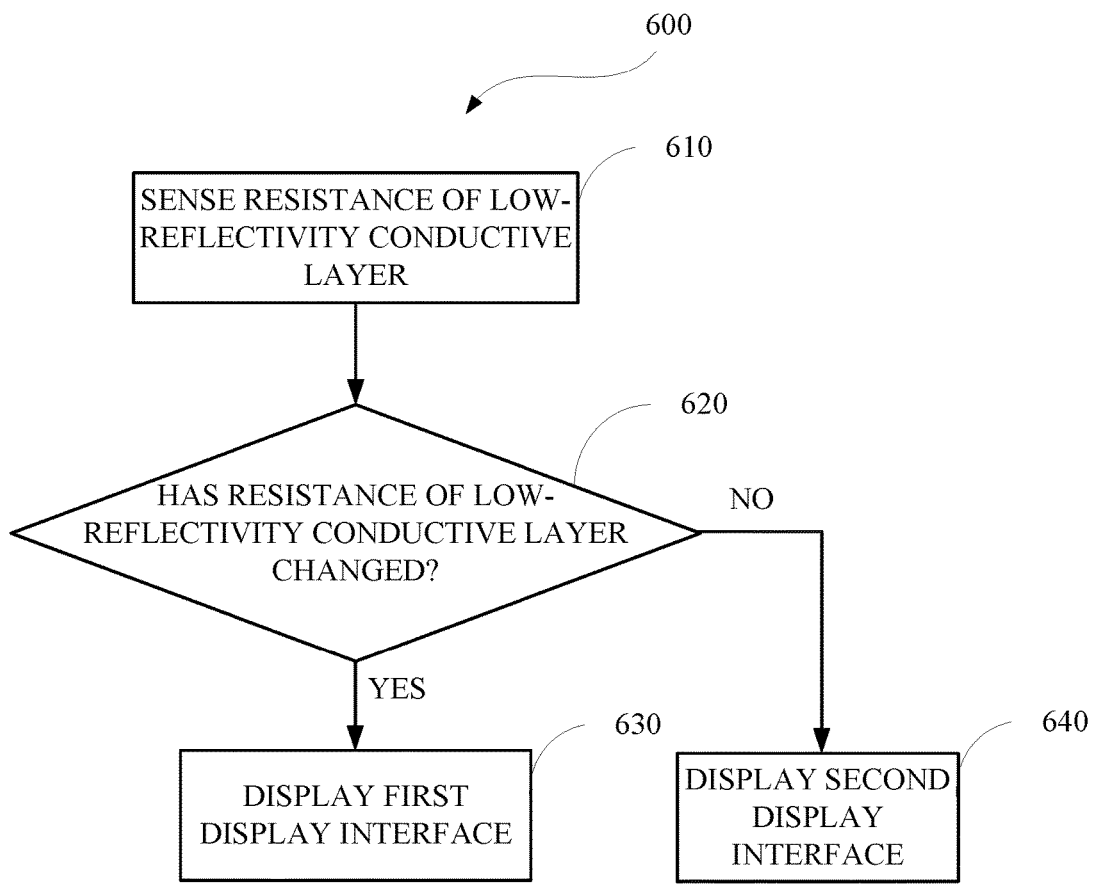
FIG. 6 illustrates a flow chart of a method of operating the display device of FIG. 3.

FIG. 6 is a flow chart of a method 600 of operating the display device of FIG. 3.

At step 610, the resistance sensor 302 senses the resistance of the low-reflectivity conductive layer.

At step 620, the controller 303 determines whether the resistance of the low-reflectivity conductive layer changes. If it is determined that the resistance of the low-reflectivity conductive layer has changed, the method 600 proceeds to step 630; otherwise the method 600 proceeds to step 640.

At step 630, the first display interface is displayed.

At step 640, the second display interface is displayed.

In embodiments of the present disclosure, the low-reflectivity conductive material is used in the bezel portion of the touch screen to replace the conventional black photoresist material (e.g., black matrix material). This may reduce the thickness of the bezel portion and thereby reduces the risk of breakage of the touch electrode. Furthermore, the electrically conductive property of the low-reflectivity conductive material allows for enhanced functionality of the display device.

Various modifications and variations may be made by those skilled in the art to the present disclosure without departing from the spirit and scope of the present disclosure. As such, if these modifications and variations fall within the scope of the appended claims and equivalents thereof, the present disclosure is also intended to encompass these modifications and variations.

What is claimed is:

1. A display device, comprising:
   a touch screen, comprising:
      a display panel;
      a cover plate located at a light exit side of the display panel;
      a plurality of touch electrodes located at a side of the cover plate facing towards the display panel; and
      a bezel portion, located at the side of the cover plate facing towards the display panel, and surrounding the touch electrodes, the bezel portion comprising a non-black photoresist layer, a low-reflectivity conductive layer and an insulating layer which are successively stacked in a direction from the cover plate to the display panel, the low-reflectivity conductive layer being insulated from the touch electrodes by the insulating layer;
   a resistance sensor, electrically connected with the low-reflectivity conductive layer, for sensing a resistance of the low-reflectivity conductive layer and for outputting a signal indicative of the sensed resistance; and
   a controller, electrically connected with the resistance sensor and the display panel, for controlling the display panel to display a first display interface in response to the signal from the resistance sensor indicating that the resistance of the low-reflectivity conductive layer has changed.

2. The display device as claimed in claim 1, further comprising a power button for powering on/off the display device, wherein the controller is configured to control the resistance sensor to sense the resistance of the low-reflectivity conductive layer in response to the power button being pressed for a first period of time.

3. The display device as claimed in claim 2, wherein the display device is a mobile communication device, and wherein the first display interface comprises an option for pressing the power button for a second period of time to call a predetermined telephone number.

4. The display device as claimed in claim 1, wherein the controller is further configured to control the display panel to display a second display interface different from the first display interface in response to the signal from the resistance sensor indicating that the resistance of the low-reflectivity conductive layer has not changed.

5. The display device as claimed in claim 1, wherein the resistance sensor is configured to continuously sense the resistance of the low-reflectivity conductive layer.

6. The display device as claimed in claim 1, wherein the low-reflectivity conductive layer surrounds the touch electrodes to form a closed structure, and wherein the resistance sensor is configured to sense the resistance of the closed structure.

7. The display device as claimed in claim 1, wherein the low-reflectivity conductive layer surrounds the touch electrodes to form a non-closed structure having a gap, and wherein the resistance sensor is configured to sense the resistance from one end of the non-closed structure to the other end.

8. A method of operating the display device as claimed in claim 1, comprising:
   sensing whether a resistance of the low-reflectivity conductive layer has changed; and displaying, by the display panel, a first display interface in response to a change in the resistance of the low-reflectivity conductive layer being sensed.

9. The method as claimed in claim 8, further comprising displaying, by the display panel, a second display interface different from the first display interface in response to no change in the resistance of the low-reflectivity conductive layer being sensed.

10. The display device as claimed in claim 1, wherein the low-reflectivity conductive layer is made of a material selected from a group consisting of molybdenum alloy, molybdenum oxide and molybdenum alloy oxide.

11. The display device as claimed in claim 10, wherein the low-reflectivity conductive layer has a thickness ranging from 45 nm to 60 nm.

12. The display device as claimed in claim 11, wherein the low-reflectivity conductive layer has a reflectivity ranging from 4% to 6%.

13. The display device as claimed in claim 1, wherein the insulating layer is made of silicon nitride.

14. The display device as claimed in claim 10, wherein the insulating layer is made of silicon nitride.

15. The display device as claimed in claim 11, wherein the insulating layer is made of silicon nitride.

16. The display device as claimed in claim 12, wherein the insulating layer is made of silicon nitride.

17. The display device as claimed in claim 13, wherein the insulating layer has a thickness ranging from 100 nm to 900 nm.

18. The display device as claimed in claim 1, wherein the touch electrodes are led out at a side of the insulating layer facing towards the display panel.

\* \* \* \* \*